(12) United States Patent  (10) Patent No.: US 7,685,544 B2
DeMaris et al.                (45) Date of Patent:   *Mar. 23, 2010

(54) TESTING PATTERN SENSITIVE ALGORITHMS FOR SEMICONDUCTOR DESIGN

(75) Inventors: David L. DeMaris, Austin, TX (US); Timothy G. Dunham, South Burlington, VT (US); William C. Leipold, Enosburg Falls, VT (US); Daniel N. Maynard, Craftsbury Common, VT (US); Michael E. Scaman, Goshen, NY (US); Shi Zhong, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 154 days.

This patent is subject to a terminal disclaimer.

(21) Appl. No.: 11/947,254

(22) Filed: Nov. 29, 2007

(65) Prior Publication Data

US 2008/0104555 A1   May 1, 2008

Related U.S. Application Data

(63) Continuation of application No. 11/202,591, filed on Aug. 12, 2005, now Pat. No. 7,353,472.

(51) Int. Cl.
    *G06F 17/50* (2006.01)
(52) U.S. Cl. .................................. 716/4; 716/5; 716/7

(58) Field of Classification Search ...................... 716/4, 716/5, 7
See application file for complete search history.

(56) References Cited

U.S. PATENT DOCUMENTS

| 6,704,695 | B1 | 3/2004 | Bula et al. |
| 6,738,954 | B1 | 5/2004 | Allen et al. |
| 6,779,165 | B2 | 8/2004 | Darden |
| 6,795,952 | B1 | 9/2004 | Stine et al. |
| 6,799,313 | B2 | 9/2004 | LaCour |
| 7,353,472 | B2 * | 4/2008 | DeMaris et al. ................ 716/4 |
| 2004/0102912 | A1 | 5/2004 | Ivanovic et al. |
| 2004/0123264 | A1 | 6/2004 | Tsai et al. |
| 2005/0188338 | A1 | 8/2005 | Kroyan et al. |

OTHER PUBLICATIONS

Duda, Richard O. et al., "Pattern Classification", John Wiley & Sons, Inc., New York, New York, 2000, pp. 561-563.
Stirniman, John P. et al., "Spatial Filter Models to Describe IC Lithographic Behavior", SPIE vol. 3051, 0277-786X/97, pp. 469-478.

* cited by examiner

*Primary Examiner*—Sun J Lin
(74) *Attorney, Agent, or Firm*—Ryan K. Simmons; Hoffman Warnick LLC

(57) ABSTRACT

A computer program product for generating test patterns for a pattern sensitive algorithm. The program product includes code for extracting feature samples from a layout design; grouping feature samples into clusters; selecting at least one area from the layout design that covers a feature sample from each cluster; and saving each pattern layout covered by the at least one area as test patterns.

10 Claims, 6 Drawing Sheets

TESTING PATTERN SENSITIVE ALGORITHMS FOR SEMICONDUCTOR DESIGN

This continuation application claims priority to issued U.S. Pat. No. 7,353,472 B2, "SYSTEM AND METHOD FOR TESTING PATTERN SENSITIVE ALGORITHMS FOR SEMICONDUCTOR DESIGN" filed on Aug. 12, 2005, Ser. No. 11/202,591, the contents of which is hereby incorporated by reference.

BACKGROUND OF THE INVENTION

1. Technical Field

The present invention relates generally to testing of software, and more specifically relates to a system and method for testing pattern sensitive algorithms used in semiconductor design and manufacture.

2. Related Art

To compensate for optical and other process distortions in semiconductor processing, optical proximity correction (OPC) is applied to design shapes. Certain configurations of shapes may be design rule compliant, yet result in systematic defects (e.g., opens, shorts, thinning, or failure of contacts or gates to overlap) when processed by such correction algorithms. In order to develop robust correction algorithms or to screen designs for such problematic shape configurations, it is desirable to identify such problematic configurations in advance of any manufacturing by testing the correction algorithms.

To perform such testing, a set of layout test cases may be collected, or artificial test cases may be synthesized through pseudo-random processes. It is desirable that such test cases are chosen to maximize the coverage of possible shape interactions, subject to the constraints given by process design rules. For low dimensions, one could in theory directly measure the coverage of a design or set of designs by direct counting. For high dimensions, a direct assessment of coverage by generating histograms of the space is impractical, as the required number of table entries is $k^d$ where k is the number of bins and d the number of feature dimensions.

Accordingly, a need exists for a system and method that can generate test cases for pattern sensitive algorithms, such as OPC algorithms.

SUMMARY OF THE INVENTION

The present invention addresses the above-mentioned problems, as well as others, by providing a system and method for generating test patterns for a pattern sensitive algorithm, which includes sampling and extracting features from a layout test case, employing a clustering method on the feature samples which is designed to guarantee coverage of a similar layout, and selecting regions on one or more designs that cover small areas chosen from the set represented by each cluster.

The method may be extended to support the building of a test case library or corpus from an existing set of test cases. New designs may be examined relative to the existing corpus and sampled layout regions may be identified which are not covered by the existing regions. A distance threshold is employed to manage the coverage of each cluster, and the distance threshold to accept new regions may be lower for regions that are similar to previously identified problem patterns.

In a first aspect, the invention provides a method for generating test patterns for a pattern sensitive algorithm, comprising: extracting feature samples from a layout design; grouping feature samples into clusters; selecting at least one area from the layout design that covers a feature sample from each cluster; and saving each pattern layout covered by the at least one area as a test pattern.

In a second aspect, the invention provides a computer program product stored on a computer usable medium having computer usable program code for generating test patterns for a pattern sensitive algorithm, said computer program product comprising: computer usable program code for extracting feature samples from a layout design; computer usable program code for grouping feature samples into clusters; computer usable program code for selecting at least one area from the layout design that covers a feature sample from each cluster; and computer usable program code for saving each pattern layout covered by the at least one area as a test pattern.

In a third aspect, the invention provides a method for processing patterns having been identified as creating flaws in a pattern sensitive algorithm, comprising: sampling patterns associated with flaws into a plurality of sampled patterns; grouping the sampled patterns into clusters such that location information and flaw severity are maintained; and sorting the sampled patterns by flaw severity and cluster membership.

BRIEF DESCRIPTION OF THE DRAWINGS

These and other features of this invention will be more readily understood from the following detailed description of the various aspects of the invention taken in conjunction with the accompanying drawings in which.

DETAILED DESCRIPTION OF THE INVENTION

Figure 1:
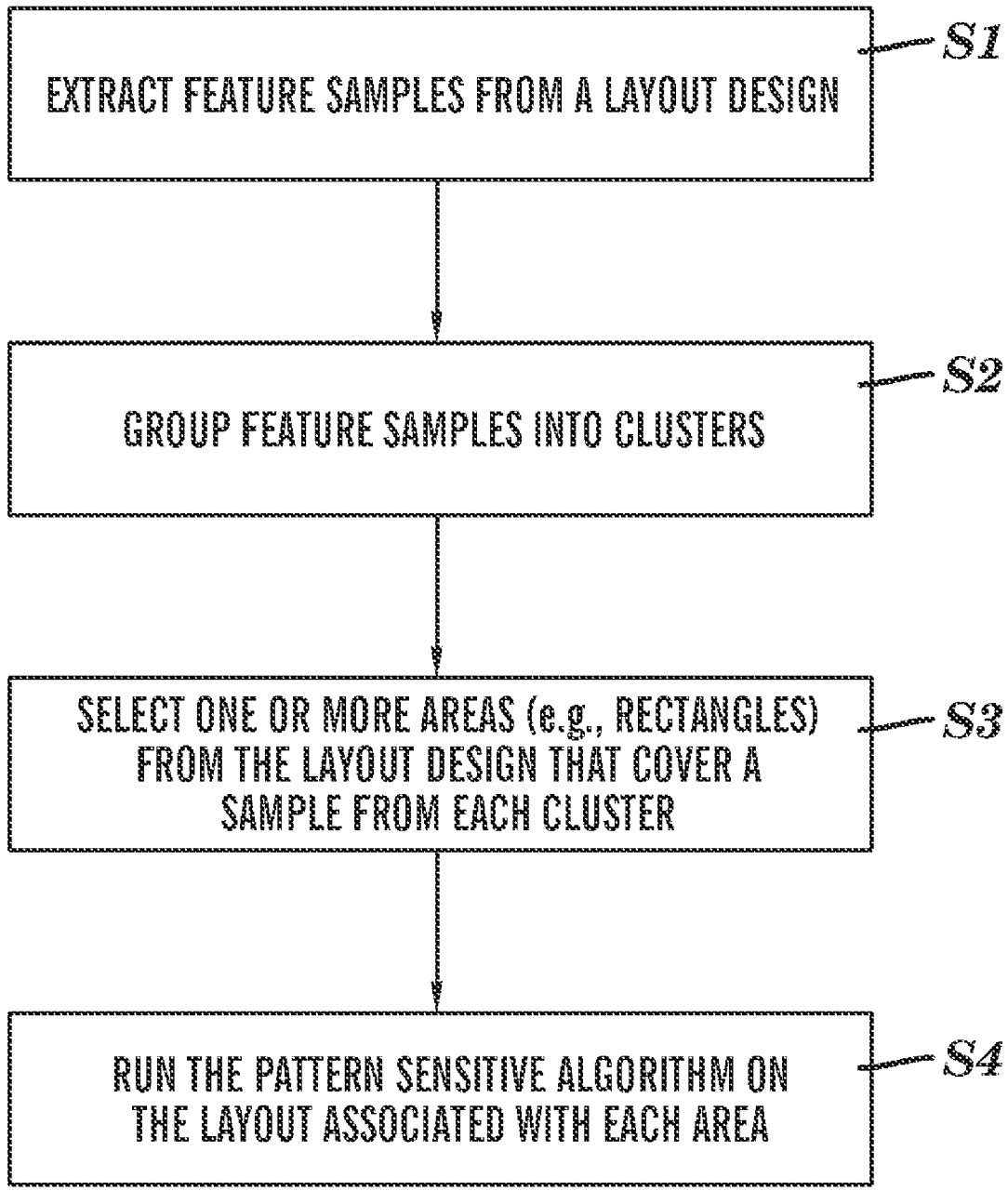
FIG. 1 depicts a flow diagram showing a process for generating test patterns from full chip layouts in accordance with the present invention.

Referring first to FIG. 1, a flow diagram is depicted showing a general methodology for generating test patterns for a pattern sensitive algorithm in accordance with an embodiment of the present invention. First at step S1, feature samples are extracted from an integrated circuit layout design. At step S2, feature samples are grouped into clusters. At step S3, one or more areas (e.g., rectangles) are selected from the layout design that covers a sample from each cluster. Finally at step S4, the pattern sensitive algorithm is run on the layout associated with each area.

Feature Extraction

Any methodology may be implemented for extracting a set of feature samples from the layout design. In one illustrative embodiment, the feature extraction process may be implemented using Walsh patterns and correlation with either Walsh patterns or low resolution Walsh transforms.

The steps involved are as follows. First, create a set of Walsh patterns whose size matches the desired region of interest size. Each pattern is represented as a layer in a cell. Next, Walsh cell instances are merged at randomly chosen sample locations in the layout, given a target coverage area (e.g., 2-10% coverage).

Next, some preprocessing may be done to steer the sampling process. For example, redundant instances of large arrays may be eliminated, and certain areas at hierarchy boundaries may be sampled more heavily than regions far away from hierarchy boundaries in order to detect some common algorithm errors associated with hierarchy interactions.

Next, the intersections of the Walsh areas with the shapes that intersect the "sample" cells bounding box are computed. A correlation function of the area intersection area with the Walsh pattern may be computed. The correlation function may be simply the area of intersection value, or by a formula such as:

area*(area intersect−(total area−area intersect)).

This formula gives a maximum when the layout area exactly matches the given pattern, and gives a negative maximum when the layout matches the inverse of the pattern. The layout with equal intersection of pattern and inverse pattern area is correlated with area. The set of area function values for N Walsh patterns constitutes an N dimensional feature vector.

Multiple layers may be used for sampling and clustering. This is useful as some algorithms are parameterized to operate on one layer differently depending on other design layers, or layers derived by intersection. For the purposes of testing a particular algorithm, the region size to be sampled is chosen based on some physical properties of the pattern sensitive process being modeled or corrected. In an illustrative embodiment, 1 μM regions may be used as the basis for clustering the layout regions. The actual areas to be covered for testing are expanded to a larger critical distance, ensuring that the sampling region chosen to physically cover each representative of a cluster have sufficient border area to account for the bulk of proximity effects. Using principal waves decomposition truncated to 3-6 terms, the state of the art suggests boundary distances of up to 6 μM, with imaging distortion falling off to 1% by 3 μm, see, e.g., Stirniman, John P. and Rieger, Michael L., Spatial Filter Models to Describe IC Lithographic Behavior, in Optical Lithography X, Proc. of SPIE vol. 3051, p 469-478, 1997.

Note that in typical VLSI layouts a large proportion of the area is dedicated to memory arrays. While the clustering process should choose only one representative case for each layout item, performing the feature extraction process on millions of samples may be wasteful. To eliminate this, a sample blocking step may be utilized as a pre-processor prior to sampling to eliminate any samples that are contained within blocked areas. One method for blocking array shapes is to discover them by characteristic patterns in the design hierarchy. Shapes may be identified that appear in cells (1) with a small number of constituent shapes, and (2) that are nested in cells with high usage counts of the cells they contain. Shapes that satisfy these thresholds are expanded, unioned, and then trimmed back in a manner so that periodic regions of the array structures are exposed for sampling, but in limited numbers. The feature extraction budget can then be spent on other areas where problems are more likely due to unseen combinations of shapes from adjacent cells. Other highly repetitive structures may also be blocked by this method, including spare cells, decoupling capacitors, etc.

Clustering

As noted above, the second step of the process is to group feature samples into clusters. Clustering may be implemented as follows: given a set of N feature vectors, K representative points are picked in the same feature space that reasonably cover the N feature vectors. By coverage, we mean that no feature vector is greater than some minimum distance from the representative point (the cluster mean, or mean of all vectors that are nearer that cluster than any other in Euclidean space). The best definition of reasonable coverage would be that all members of a cluster behave the same way with respect to any software defect which changes the topology or circuit behavior of the layout. In practice this may be estimated by looking at known bad examples, or by choosing a conservative (low) minimum distance with some risk of testing more than the minimum number of patterns.

Next, a reduced area of the real layout is sought that contains layouts sufficiently near (i.e., within some distance epsilon $\epsilon$) each representative point. One could either fix K and find the distance $\epsilon$, or fix $\epsilon$ and find K.

One approach involves the use of a balanced clustering that forces the number of data points in each cluster to be balanced, thus avoiding empty clusters and maximizing the utilization of clusters. There are limitations however with this approach: two clusters with the same number of data points may have very different density or space size, i.e., they may be balanced in terms of the number of points, but not balanced in terms of coverage. Therefore, a set of clusters that are balanced in terms of space size or diameter may be preferred such that all data points in a cluster are close to the center (representative) of the cluster.

One approach to this problem is to adapt competitive learning techniques for clustering, including k-means or neural-gas algorithms that minimize the mean squared error objective function but have an added set of constraints that enforces the distance between any data point and its cluster mean to be smaller than a certain threshold $\epsilon$ (epsilon) which may be provided by the user. There is some similarity to clustering methods known as leader-follower (see, e.g., Duda, Hart, Stork, "Pattern Classification," Wiley Interscience, New York, p. 562.) and to the ART map, but the present method is intended to provide a guarantee that none of the sampled feature vectors (and the corresponding representative layout) is greater than 2*$\epsilon$ distance from the representative layout chosen.

Clustering with hard constraints often poses a very difficult optimization problem. An easier approach would be to use a penalized objective function. One can penalize the original k-means objective function (mean-squared error) with a cost for every distance larger than predefined threshold, as follows:

$$E = \sum_i [(x_i - c_j)^2 + (|x_i - c_j| - \varepsilon)^2 * P(|x_i - c_j| > \varepsilon) * C]$$

where $c_j$ is the closest cluster mean to data point $x_i$;

$\epsilon$ is a pre-specified radius threshold;

$P(|x_i-c_j|>\epsilon)$ is a predicate function that takes value 1 when the condition in the parentheses holds, and 0 otherwise; and C is a parameter to tradeoff between minimizing MSE objective and reducing the number of data points that are at a distance larger than $\epsilon$ from their cluster means.

This objective function can be further modified for computational efficiency and minimized using gradient descent optimization techniques.

There are two additional important criteria for the clustering. One is that there are no empty clusters, so that estimates of the required number of clusters are accurate and the data points are not under-represented. This goal is achieved by replacing empty clusters with the most distant point for some clusters during each iteration.

The second important criteria is that clusters should be distinct and not overlapping. Overlapping clusters will cause unnecessary work in subsequent steps unless they are recognized and eliminated from testing. Since it may be costly to account for overlapping during clustering, clusters with centers closer than $\epsilon$ may be merged as a post processing step. Alternatively, the objective function used in clustering can include a penalty for moving cluster representative points closer to nearby clusters.

Selecting Areas for Testing

Summarizing the previous steps, a layout is sampled such that each sample's layout positions are maintained. Next, the samples are grouped into a set of distinct clusters. In this step, test cases for the pattern sensitive algorithms are generated based on a set of contiguous layout areas from the set of clustered samples. These areas should maximize test coverage of the pattern space while minimizing computational time. One illustrative approach is to identify sample rectangles (i.e., areas) that spatially cover one data sample associated with each cluster. Moreover, the approach may attempt to cover many cluster representatives with each rectangle. Because the clustering approach guarantees that no cluster representative is more than $\epsilon$ away from the cluster mean, it is relatively certain that the chosen representative is sufficiently close in pattern space to all other cluster members. Some examination of the cluster membership on known problem layouts (i.e., those which cause the pattern processing software to fail) is recommended to set an appropriate value such that a cluster does not contain both failing and non-failing members.

Using this approach, the first step is to begin with no sampling rectangles, such that all clusters are initially uncovered by any sampling rectangles. Initially the entire layout region is available to search, and an initial width and height of an area sampling rectangle to use for a search can be provided. Additionally, a target minimum coverage, a maximum total area of area sampling rectangles allowed, and a maximal number of area sampling rectangles allowed may be specified.

Based on the parameters of the sampling rectangle, a "greedy search" may be done for the cluster member with maximal coverage where clusters are selected from the minimal member population. This may be done by selecting a set of N cluster member coordinates selected from the set of uncovered clusters with the minimum member population count. Using these N member coordinates, a sampling rectangle is centered on each of the N member coordinate selected. For each such sampling rectangle, all members of the uncovered clusters are traversed in order to count how many uncovered clusters have a member contained in the sample rectangle. We take the sampling rectangle with the highest coverage score and then shrink the rectangle to the rectangular boundary which contains at least one of all cluster members contained. This could most simply be accomplished by shrinking to the external members in x and y, i.e., the maximum and minimum x and y of the cluster members contained in the area sampling rectangle. Additionally, the process could discard a member on the edge of the shrunken rectangle if the member's parent cluster has another member contained inside the rectangle not on the edge.

Next, the set of clusters covered by this sampling rectangle can be moved to a covered cluster set. The search is a "greedy search" in the sense that once a cluster has been covered by a prior rectangle, it no longer is searched for within a covered cluster. In addition, one could "telescope" the search by selecting one or more coverage targets by reducing the size of the area sampling rectangle by some fraction where they meet.

Next, the aforementioned greedy search can be repeated for the cluster member with maximal coverage where clusters are selected from the minimal member population until the coverage target is reached. A coverage target (i.e., the stopping condition for the rectangle selection algorithm) can be provided in terms of a minimal coverage required expressed as a percentage of clusters, a maximum total area of area sampling rectangles or a maximum number of area sampling rectangles.

Further post processing may also be done on the obtained set of area sampling rectangles in several ways. For instance, an overlapping area sampling rectangle with a prior one may be combined. This may be done by replacing both overlapping rectangles by the minimum sized rectangle that contains both, thus absorbing both.

After overlapping area sampling rectangles are combined, the area sampling rectangles can be fractured into smaller fractured rectangles should a larger number of smaller processing area sampling rectangles be desirable. A fracturing approach may be utilized to improve the processing speed at the expense of a less optimal solution in which large rectangles are used to do a quicker greedy search.

The resulting set of fractured area sampling rectangles may then be padded by an amount to assure sufficient processing overlap. The resulting padded set may be grown to a minimal size, resulting in a final set of area sampling rectangles suitable to use for testing. The aforementioned padded area may also be marked to indicate no rule checking in the overlap area if desired.

Note that the greedy search using clusters with minimum population is heuristically based on the concept that finding a set of area sampling rectangles that cover all clusters requires that the clusters are covered with one or few members. Moreover, by centering sampling rectangles on these clusters with fewer members, it is more likely that clusters with more members will be sampled than vice versa.

Figure 2:
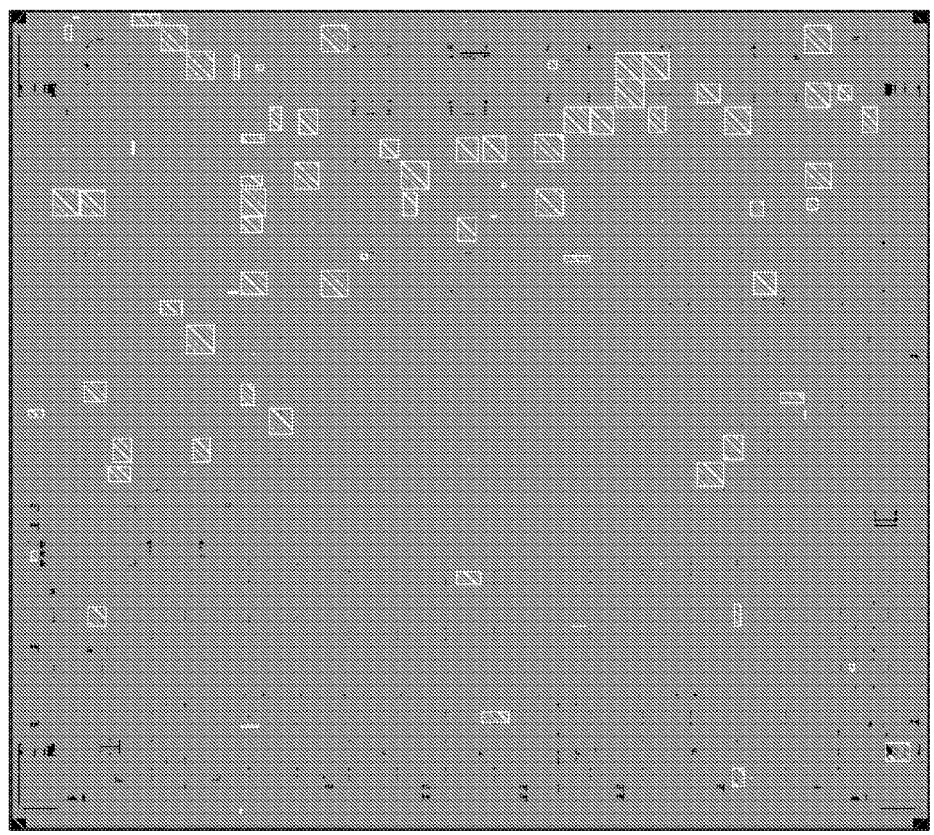
FIG. 2 depicts an example of a set of regions found on a semiconductor layout sampled in accordance with the present invention.

FIG. 2 depicts an example of 106 regions found covering 2.2 mm$^2$ on a semiconductor layout which was sampled with a series of 250×250 micron or smaller rectangles in accordance with the present invention, to achieve 100% coverage of 1491 clusters. Areas may shrink from the default size to smaller regions which cover only the clusters not yet covered contained in other regions. This sampling would assume a highly parallel running scheme would be used to process the test cases. One can see from the distribution that some areas of the layout have very few samples due to the highly repetitive nature, where others are much more densely selected.

Figure 3:
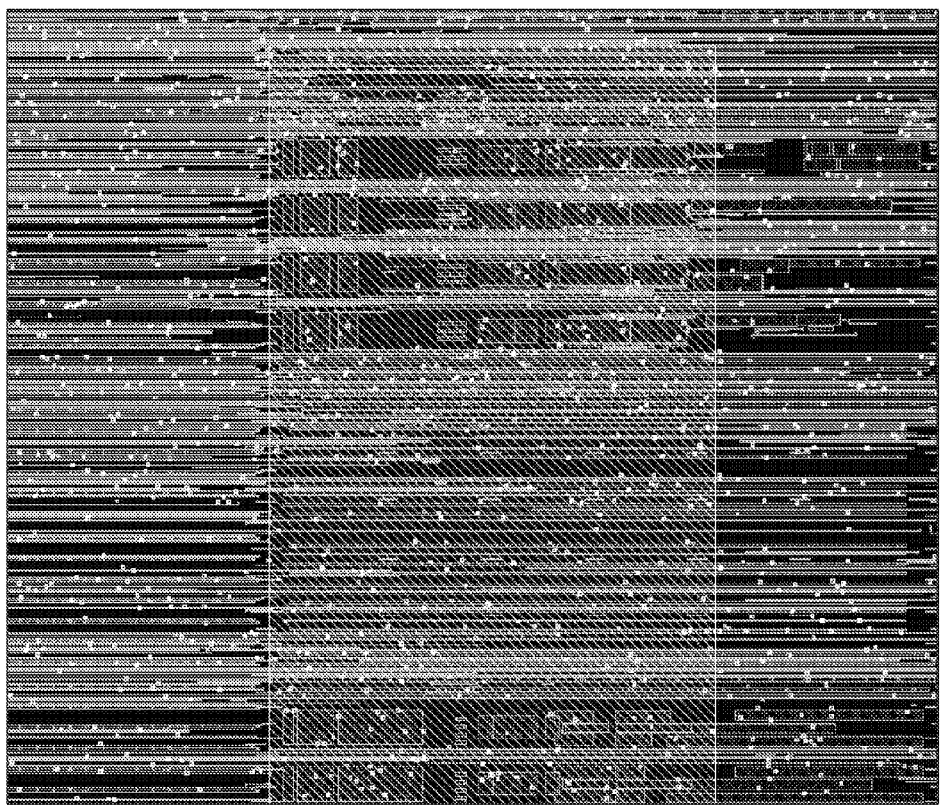
FIG. 3 depicts a zoomed in view of an example of test regions found on a semiconductor layout in accordance with the present invention.

FIG. 3 depicts a zoomed in view of an example of test regions found on a semiconductor layout. The individual samples subjected to feature extraction and clustering are shown as small rectangles. Some of the samples shown were selected as representatives of clusters. The layout analyzed in this example is M3, one of the metal interconnect levels.

Figure 4:
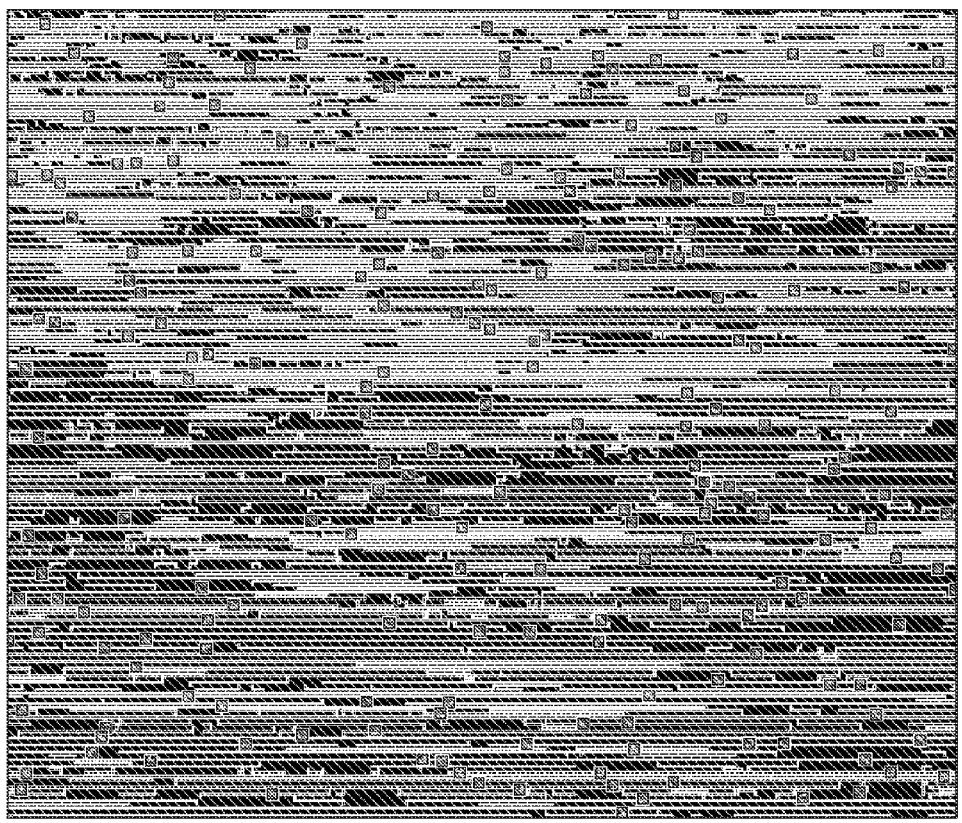
FIG. 4 depicts a further zoomed in view of a portion of the semiconductor layout in the rectangle covering the largest number of unique clusters, with sample locations overlaid on the layout in accordance with the present invention.

FIG. 4 depicts a further zoomed in view of a portion of the semiconductor layout in the rectangle covering the largest number of unique clusters, with sample locations overlaid on the layout. It can be seen that the area is quite diverse in width and spacing, and contains many jogs and wrong way metal segments. This diversity, along with the early visitation in the area selection process, allowed one rectangle to cover 26% of all clusters found on the chip by including one or more representative sample locations belonging to that cluster.

Testing

Finally, once the set of rectangles are identified, the layout can be prepared for testing. One illustrative method is as follows:

for each rectangle in cover rectangles:

expand the rectangles sufficiently to capture proximity induced effects extract the layout clipped to the rectangle boundaries;

(Alternatively, use the rectangles as a constraint on the OPC) run the pattern sensitive algorithms and checking processes OPC and ORC (Optical Rule Checking); and screen out any ORC errors within 1.0 um of the window boundary.

(Alternatively, generate a directive to the checking code to prevent reporting of errors associated with window boundaries.)

To demonstrate the effectiveness of the approach, the method was applied to a layout and a particular version of optical proximity correction code known to produce errors on that layout. All error types found on the full design were reproduced in the test case consisting of 1.07 sq. mm. The runtime of the reduced test case was only 18% of the runtime for the 266 sq. mm full chip test case (367 CPU hours vs. 2143 hours). It is possible that the number of clusters chosen initially was conservative (i.e. too large) and thus a better performance improvement is achievable. Additionally, areas at random locations were selected in the chip layout with the same size distribution as the areas selected using the approach described above; none of the error types were detected with this random baseline approach.

Figure 5:
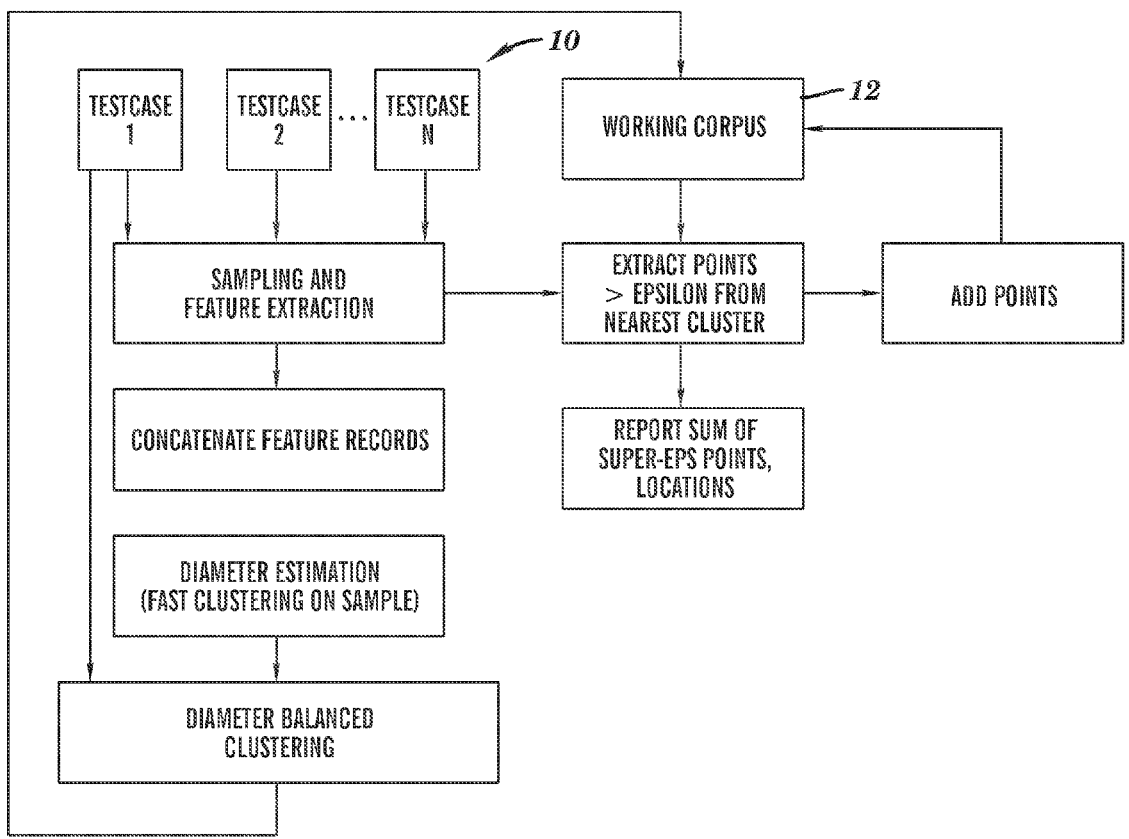
FIG. 5 depicts a method of extending the process of FIG. 1 to combine many design test cases into a reduced or compressed test suite, or "corpus," in accordance with the present invention.

While effective for a single test case, the method described can also be extended to combine many design test cases into a reduced or compressed test suite, or "corpus." The extended method is shown in FIG. 5. Essentially, the process described above is used to estimate the diameter on samples from many test cases 10 in parallel. Then, the full diameter balanced clustering can be run on each test case 10 (e.g., test case 1, 2, . . . N) in succession. The results of the first run are the seed of a "working corpus" 12. When processing the second run, clustering on the second test case may not be necessary. It may be sufficient to compare the feature examples, and add any points not already "covered," i.e., they are less than $\epsilon$ distance from existing cluster means. Points exceeding this distance are referred to as super-$\epsilon$ points. If a small number of such points is found, they may directly be added as new "centers" to the working corpus (i.e., their pattern space vectors and coordinates are concatenated).

If a large number of points is found (i.e., the number of super-$\epsilon$ points is greater than K/$\alpha$, where K is the number of clusters in the corpus and $\alpha$ is some empirical factor), then the test case can be run through the clustering process to add cluster means rather than points. If the test case ordering is chosen such that large diverse test cases are processed first, the clustering of subsequent cases can probably be avoided. Only clusters which are brand new or significantly moved in the re-clustering process will have representative points selected in the current layout.

When particular layout patterns are discovered or known to have caused OPC failures in the past, their feature descriptions may be added to the corpus, marked, and treated specially in the process. In particular, one may scale the $\epsilon$ value around these points in pattern space, allowing additional clusters or admitting more test cases than would be the case for other arbitrary layouts corresponding to safer areas in the pattern space.

In testing of pattern sensitive processes, it is important to rapidly discover whether a code change causes errors or extreme performance degradation on cases other than the one(s) that motivate the change. Even the test case compression described above, when the parameters are chosen to ensure that all known errors are caught on some example, may require some hundreds of CPU hours and several real time hours with parallel servers. In order to do very quick testing, the following extension may be utilized. This extension can be performed for single designs, or for a corpus created as described above.

The main idea is to first test on a very small number of test cases chosen according to some orthogonality criteria. The idea is to maximize the span of the chosen test cases over the pattern space as well as the total distance between candidates. The following approach may be initially used:

1. Compute clusters from the sample data as above;
2. For each cluster, compute the distance to all cluster means, identify the nearest neighbor and record the distance.
3. Sort the list of clusters by distance to nearest neighbor, minimum to maximum.
4. To keep N clusters, remove at most K-N entries from the top of the list (i.e., remove clusters nearest to other clusters).
5. If the distance to nearest neighbor distribution of N remaining clusters has small variance, an alternative pruning is proposed:
   a. Remove fewer than K-N clusters.
   b. Compute the global mean of all clusters, and for each candidate the distance to global mean.
   c. Sort the remaining clusters by distance to global mean (maximum to minimum).
   d. Choose the first N entries (i.e., keep clusters most distant from mean).

Variations on this process, such as sorting the list on some combined objective function weighting inter cluster difference vs. distance from mean, may also be effective. For the chosen clusters, area selection is performed as described above. A typical test scenario might involve a sequence such as: Perform tests with 100, then 500 (i.e., 400 new clusters plus the first 100), then 1000, then maximum clusters, then full chip. At any testing stage, discovery of errors or large performance impacts may abort the testing process and trigger code reviews or changes.

Further alternative approaches to the described methodology are as follows. The most ideal ORC might be to divide up the layout and traverse it in a smart cluster aware order where the most variation is covered first and the least variation last. This is similar, but different, from the clustered sampling we describe above for layouts. This process would involve a sorting of the entire layout just to prioritize the order traversed with the entire layout being exhaustively checked and possibly more acceptable to some applications than a true sampling. In this embodiment, the areas associated with high variation would tend to be checked first and reported at some checkpoint or possibly be continuously made available for checking at the convenience of the operator. In this embodiment, the ORC gives partial results as it goes, and checks the entire layout. However, the order is determined by the most plentiful unchecked clusters first and is very similar to the sample searching.

Another variation to the process involves further sampling of the early sample windows to reduce cluster translation aliasing or misses. To improve the compression of the sampling after the first high population sample window is found, perform more intensive samples on this small area window and identify clusters that were not originally known. This is a simple way to identify clusters which are already being captured by the sample window that may not have been in the original sampling.

Flaw Processing

Often, an automated pattern checking process or inspection process is followed by a manual review of the flaws detected. Many types of simulation or process checking, including optical rule checking of masks, automated inspection systems (AOI), electrical testing or other types of systems that produce a list of potential flaws, must be verified by an operator manually. In some situations the number of flaws may be large, possibly taxing the attention of the human operator. Accordingly it may be desirable to present flaws to an operator for review in a way that minimizes escapes and maximizes operator efficiency.

Ideally, flaws presented to a human operator for review to should be sorted in a manner which would tend to place the more unusual flaws toward the front of the flaw list, and place flaws associated with frequently used patterns towards the end. Similarly, it is desirable to group flaws associated with similar patterns together so that an operator may browse through them in an enhanced manner.

Figure 6:
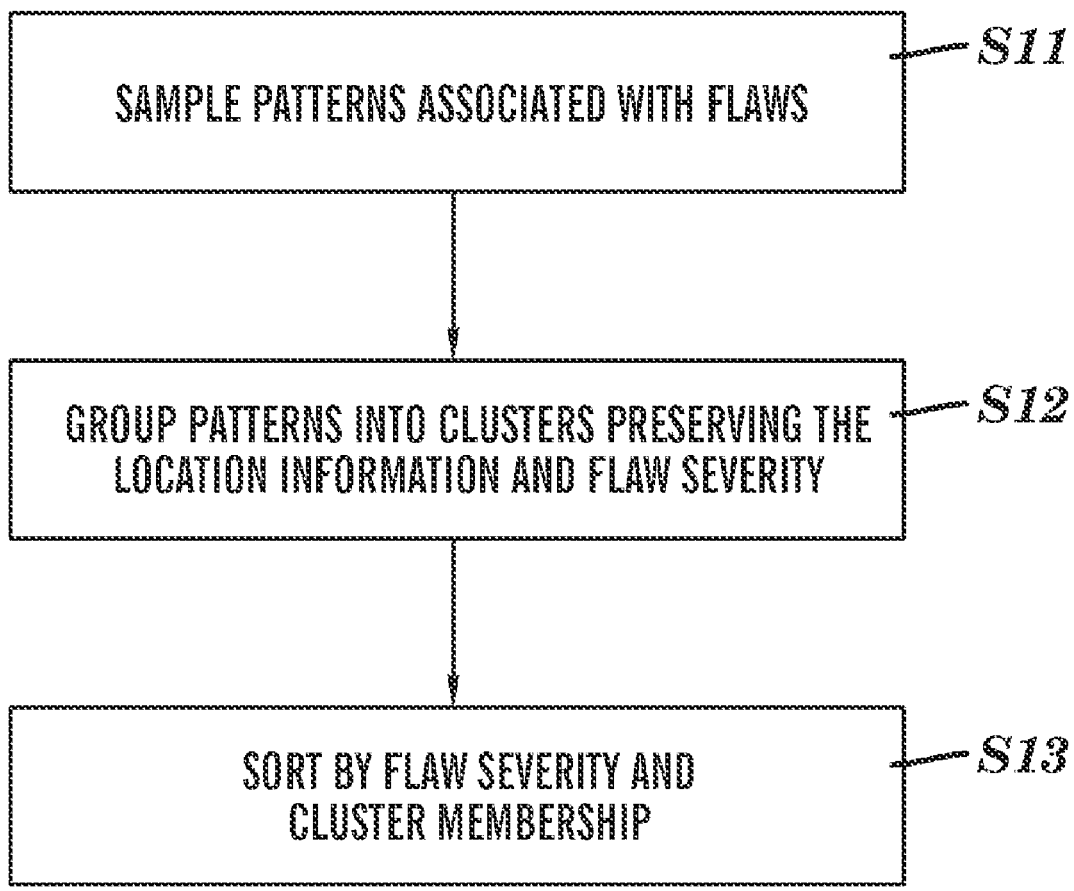
FIG. 6 depicts a flow diagram of a method for processing flaws, using a similar clustering process to group the flaws for efficient review by an operator.

To achieve this, a process is provided in which each flaw location in the design data is identified and the patterns associated with the flaw are sampled. The process is shown in FIG. 6. At the first step S11, patterns associated with flaws are sampled. Next at step S12, the samples are clustered, preserving the location information and flaw severity of the members. At step S13, the flaws are then sorted into a more ergonomic list to present to the operator in a manner that will minimize the chance of a defect escape and maximize the efficiency of the review.

The sampling and clustering process is essentially the same as that described above. The main difference here is that rather than sampling an area, the sampling is done only at the locations associated with the flaws needing review. In addition to presenting the operator with a more ergonomic list of flaws, the review station could more intelligently browse through flaws or dynamically use additional clustering to sub-cluster the existing clusters based on the operator's flaw dispositions. Additionally, should there be modes of excessive overkill associated with certain clusters, the flaw list may be resorted to either place such clusters last or remove them if desired.

This process is described in further detail as follows. A device is checked according to some inspection or rule checking process, possibly ORC following OPC or ORC following some other data preparation process. The pattern design data and any other associate pattern data, possibly produced by a prior OPC process or other data, is available for analysis along with the list of locations of the flaws (and possibly some other information such as flaw severity for example).

As previously mentioned the pattern design data and associated pattern data such as OPC patterns at each of the flaw locations is sampled and clustered as described above. In this illustrative embodiment, the flaws are first sorted according to highest flaw severity to lowest and second according to the clusters with the least member population. In this way the flaws believed to be most serious are shown first and are also sorted in order of most unusual to most frequently. Additionally, it is also possible to present the operator a short list containing a member of each cluster of flaws allowing the operator to get a cross section of the flaws, should there be an exceeding large number of them.

These features may be achieved by preprocessing the flaw output and design data, and sorting it prior to being reviewed, presenting the review station and operator with better more ergonomically sorted lists of flaws.

Using this process, flaws could be browsed at the review phase, where the review station or procedure is "cluster aware," and can exploit the information obtained at the aforementioned cluster step. An operator could browse through flaws using cluster type and severity. If there was excessive overkill associated with one cluster, an operator could skip flaws associated with that cluster, defer them to later or even disposition them as good or bad as a group should engineering controls allow.

Moreover, if the review station is not only cluster aware, but also cluster capable, there could be further clustering, e.g., a sub-clustering using the new information of the operators dispositions of members of a cluster, dispositioning members more similar to the different categories of the operator disposition into sub-clusters. If an operator classifies some flaws of a cluster as acceptable and others as some defect category, the new category information might be used to split a cluster into several sub categories within the original cluster. A re-clustering process could be initiated with a smaller value of epsilon reducing the chance that software induced defects are clustered with non-defect cases.

Should it not be possible for reasons of practicality to make the operator review station "cluster aware" and integrate the ability to group flaws and browse them, a simpler implementation would be to allow an operator to go back to the original output in order to either filter out some flaw clusters or to force them to be placed at the end of the flaw list. This may be desirable if the operator recognized that the flaws associated with a certain cluster or clusters tend to be excessive in number.

Note that in addition to Walsh pattern correlation feature extraction and modified K-means clustering as described above, other types of feature extraction such as families of wavelets, and other families of discrete transforms could be utilized. Moreover, in addition to ORC review of simulated patterns for lithography, this process may be applied to areas such as mask inspection, packaging inspection, and review of data from electrical test whenever the design shapes are brought into bearing on the manual review.

It should be appreciated that the teachings of the present invention could be offered as a business method on a subscription or fee basis. For example, a computer system comprising a test pattern generation system/corpus could be created, maintained and/or deployed by a service provider that offers the functions described herein for customers. That is, a service provider could offer to generate test patterns or provide a corpus of test patterns as described above.

It is understood that the systems, functions, mechanisms, methods, engines and modules described herein can be implemented in hardware, software, or a combination of hardware and software. They may be implemented by any type of computer system or other apparatus adapted for carrying out the methods described herein. A typical combination of hardware and software could be a general-purpose computer system with a computer program that, when loaded and executed, controls the computer system such that it carries out the methods described herein. Alternatively, a specific use computer, containing specialized hardware for carrying out one or more of the functional tasks of the invention could be utilized. In a further embodiment, part of all of the invention could be implemented in a distributed manner, e.g., over a network such as the Internet.

The present invention can also be embedded in a computer program product, which comprises all the features enabling the implementation of the methods and functions described herein, and which—when loaded in a computer system—is able to carry out these methods and functions. Terms such as computer program, software program, program, program product, software, etc., in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

The foregoing description of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of this invention as defined by the accompanying claims.

The invention claimed is:

1. A computer program product stored on a computer usable medium having computer usable program codes being utilized by a computer for generating test patterns for a pattern sensitive algorithm, said computer program product comprising:
    computer usable program code for extracting feature samples from a layout design utilizing Walsh patterns and a correlation with either the Walsh patterns or low resolution Walsh transforms;
    computer usable program code for grouping extracted feature samples into clusters;
    computer usable program code for selecting at least one area from the layout design that covers at least one of the extracted feature samples from each cluster; and
    computer usable program code for saving each pattern layout covered by the at least one area as a test pattern.

2. The computer program product of claim 1, wherein the computer usable program code for extracting feature samples is done by sampling regions on at least one layer of the layout design.

3. The computer program product of claim 1, wherein the extracted feature samples are saved as feature vectors.

4. The computer program product of claim 1, wherein the computer usable program code for grouping extracted feature samples into clusters utilizes an algorithm that includes a penalized objective function.

5. The computer program product of claim 1, wherein there are no empty clusters.

6. The computer program product of claim 1, wherein an overlap between the clusters is minimized using a technique selected from a group consisting of modifying an objective function penalizing overlap and merging the clusters with substantial overlap.

7. The computer program product of claim 1, wherein the at least one area comprises at least one rectangle.

8. The computer program product of claim 1, wherein each cluster has a cluster mean and each feature sample within a cluster resides within a distance epsilon from the cluster mean.

9. A computer program product stored on a computer usable medium having computer usable program codes being utilized by a computer for generating test patterns for a pattern sensitive algorithm, said computer program product comprising:
    computer usable program code for extracting feature samples from a layout design;
    computer usable program code for grouping extracted feature samples into clusters utilizing an algorithm that includes a penalized objective function;
    computer usable program code for selecting at least one area from the layout design that covers at least one of the extracted feature samples from each cluster; and
    computer usable program code for saving each pattern layout covered by the at least one area as a test pattern.

10. A computer program product stored on a computer usable medium having computer usable program codes being utilized by a computer for generating test patterns for a pattern sensitive algorithm, said computer program product comprising:
    computer usable program code for extracting feature samples from a layout design;
    computer usable program code for grouping extracted feature samples into clusters;
    computer usable program code for selecting at least one area from the layout design that covers at least one of the extracted feature samples from each cluster; and
    computer usable program code for saving each pattern layout covered by the at least one area as a test pattern;
    wherein an overlap between the clusters is minimized using a technique selected from a group consisting of modifying an objective function penalizing overlap and merging the clusters with substantial overlap.

* * * * *